(12) United States Patent
Hamada et al.

(10) Patent No.: US 8,663,756 B2
(45) Date of Patent: Mar. 4, 2014

(54) PELLICLE KIT FOR MANUFACTURING A PELLICLE

(75) Inventors: Yuichi Hamada, Annaka (JP); Tatsuya Sema, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 45 days.

(21) Appl. No.: 13/367,719

(22) Filed: Feb. 7, 2012

(65) Prior Publication Data

US 2012/0202001 A1  Aug. 9, 2012

(30) Foreign Application Priority Data

Feb. 8, 2011  (JP) .................................. 2011-024734
Dec. 26, 2011  (JP) .................................. 2011-283855

(51) Int. Cl.
  *G03F 1/14*  (2006.01)
  *G03F 1/00*  (2012.01)
  *G03F 1/62*  (2012.01)

(52) U.S. Cl.
  USPC .................................. 428/14; 430/5; 428/99

(58) Field of Classification Search
  USPC .......................................... 430/5; 428/14, 99
  See application file for complete search history.

(56) References Cited

U.S. PATENT DOCUMENTS 4,861,402 A  8/1989  Gordon
2006/0240199 A1 * 10/2006  Sekihara ........................ 428/14

FOREIGN PATENT DOCUMENTS

| JP | S58-219023 | 12/1983 |
| JP | S63-027707 | 6/1988 |
| JP | H07-024390 | 1/1995 |
| JP | 2002156744 A * | 5/2002 |

OTHER PUBLICATIONS

Machine Translation of JP-2002156744.*

* cited by examiner

*Primary Examiner* — Stewart Fraser
(74) *Attorney, Agent, or Firm* — Manabu Kanesaka

(57) ABSTRACT

There is provided a pellicle kit for manufacturing a pellicle which comprises a pellicle frame having a jig hole in the outer wall of its frame bar and a jig having a jig pin which is adjusted to enter the respective jig hole until the front end of the jig pin is abutted against the tapered bottom face of the jig hole to thereby fix said pellicle frame.

10 Claims, 3 Drawing Sheets

F I G. 1
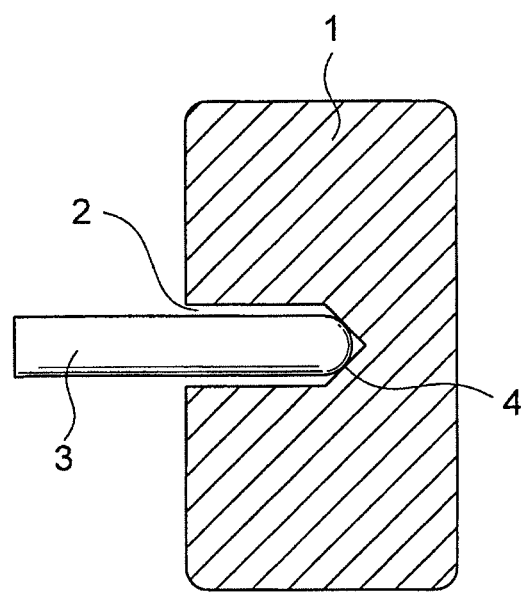

F I G. 3
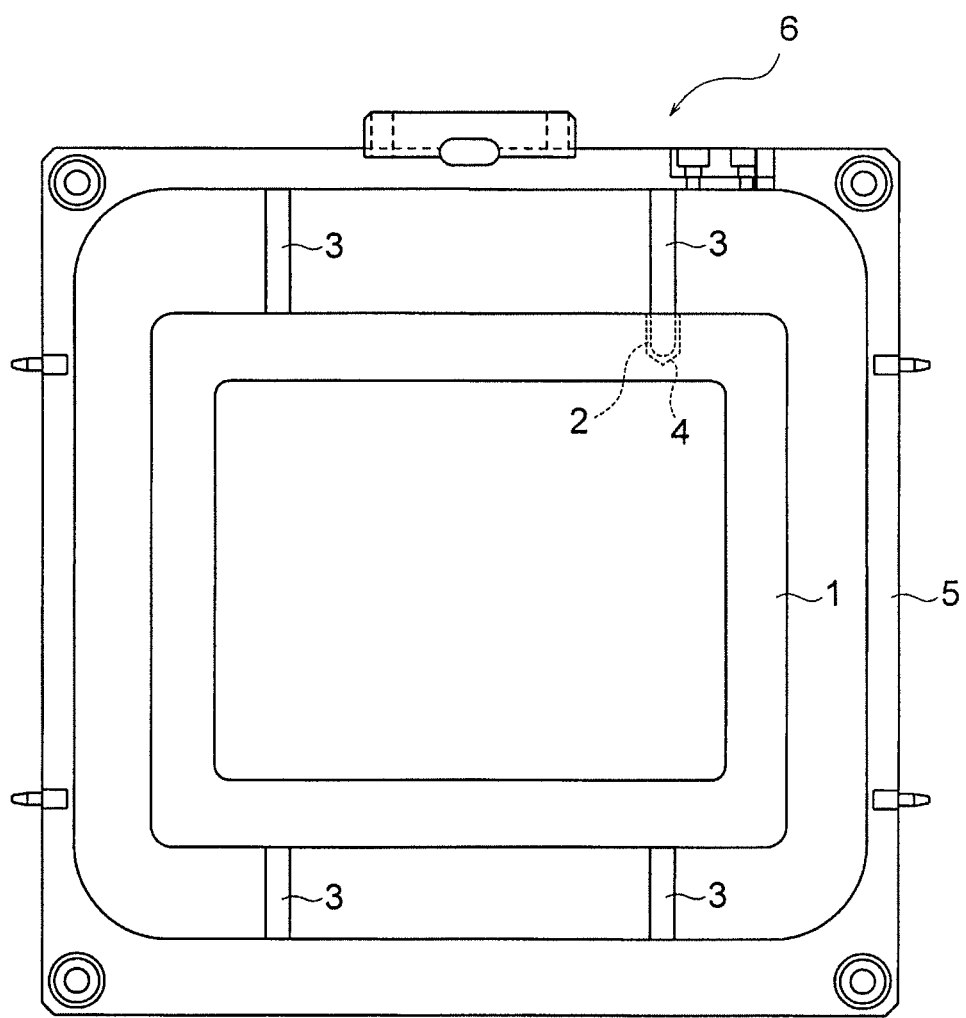

PELLICLE KIT FOR MANUFACTURING A PELLICLE

PRIORITY CLAIMED

The present non-provisional application claims priority, as per Paris Convention, from Japanese Patent Applications No. 2011-024734 filed on Feb. 8, 2011 and 2011-283855 filed Dec. 26, 2011, the disclosure of which is hereby incorporated by reference herein in its entirety.

FIELD OF THE TECHNOLOGY

The present invention relates to a pellicle kit used in a manufacturing process of a pellicle for lithography—which is used to fend off dust from a mask for lithography during a process of manufacturing a semiconductor device such as LSI and VLSI or a liquid crystal display panel.

BACKGROUND OF THE INVENTION

In the manufacture of a semiconductor device such as a large scale integrated circuit (LSI) and a very large scale integrated circuit (VLSI), or a liquid crystal display panel, a semiconductor wafer or a mother substrate for a liquid crystal display panel is irradiated with exposure light via an exposure stencil such as a photomask or a reticle, whereby a pattern of the stencil is transferred onto the surface of the wafer or the mother substrate; however, if a dust particle exists on the stencil, this particle can absorb or bend the exposure light to thereby deform the pattern or blur the edges of the pattern transferred; furthermore the underlying surface is also blackened by soiling, whereby the size, quality, appearance and the like of the semiconductor wafer or the liquid crystal display panel mother substrate are degraded. In the present invention, an "exposure stencil" shall mean a mask for lithography or a reticle.

In order to prevent these problems, the operation of exposing the substrates is generally conducted in a clean room. However, even in a clean room environment, it is not always easy to keep the exposure stencil dust-free, and hence in order to fend off the dust from the surface of the exposure stencil, a pellicle which passes exposure light well is attached to cover the exposure stencil.

In this manner, the dust is prevented from reaching the surface of the exposure stencil but can only alight on the pellicle membrane so that, if the exposure light is set to focus on the pattern of the exposure stencil, the dust on the pellicle membrane fails to shadow itself in the transferred pattern.

In general, a pellicle is manufactured by adhering a pellicle membrane to one annular face of a pellicle frame. The pellicle membrane is made of a nitrocellulose, cellulose acetate, a fluorine-containing polymer, or the like that has a high transmittance with respect to an exposure light (such as g-line, i-line, KrF excimer laser, ArF excimer laser, and $F_2$ excimer laser). The pellicle frame is made of an aluminum alloy such as A7075, A6061, and A5052, which are black almite-anodized in the surface, or of a stainless steel or of polyethylene, etc.

The adhesion of the pellicle membrane to an annular face of the pellicle frame is effected by laying a solvent capable of dissolving the pellicle membrane on the annular face and placing the membrane over the solvent and drying the latter by air flow (ref. IP Publication 1), or by using an adhesive such as acrylic resin, epoxy resin and fluorine-containing resin (ref. IP Publications 2 and 3). Furthermore, on the other one of the two annular faces of the frame is laid a stencil-bonding agglutinant layer made of a polybutene resin, a polyvinyl acetate resin, an acrylic resin, a silicone resin or the like for attaching the pellicle frame to the exposure stencil, such as a reticle or a mask, and over this stencil-bonding agglutinant layer is laid a releasable liner for protecting the stencil-bonding agglutinant layer.

The application of the adhesive and the agglutinant to the pellicle frame is done by brush painting, spraying, dipping, squeezed-laying from a tube or a cartridge, or automatic dispensing, and the automatic dispensing is the most appropriate in that it provides quantitatively precise application. As an automatic dispenser it is possible to use a liquid application apparatus such as the ones disclosed in IP Publication 4.

A pellicle is set in a manner such that the pellicle frame entirely surrounds the pattern region formed in the surface of the exposure stencil. As the pellicle is installed for the purpose of preventing the dust from adhering to the exposure stencil, the pattern region is thereby isolated from the external atmosphere so that the dust outside the pellicle cannot reach the pattern region.

In recent years, the design rules for LSI have been modified in the direction of heightening the resolution density as high as sub-quarter micron order, and this goes hand-in-hand with shortening of the exposure light wavelength. In other words, the formerly prevalent g-line (436 nm) and i-line (365 nm) created by mercury lamps are being replaced by KrF excimer laser (248 nm), ArF excimer laser (193 nm), $F_2$ laser (157 nm) and the like. With the increasing exposure resolution accompanied by the shortening of the wavelengths of the exposure lights, a concern being harbored anew is the fact that a warping and deformation of the pattern itself, which formerly was scarcely a problem, has become a problem in that they affect the yield of the product. The warping and deformation of the pattern is usually caused by the warping and deformation of the exposure stencil itself. And this warping and deformation of the exposure stencil is chiefly caused when the pellicle is attached to the exposure stencil.

It is known that it is the warping and deformation of the pellicle itself that renders an ill effect on the exposure stencil at the time of pellicle attachment.

A pellicle jig 5, which is a part of a pellicle kit 6 as shown in FIG. 3, is constituted by a square or rectangular frame substantially larger than a pellicle frame 1 to be handled, which is another part of the pellicle kit 6, and one pair of opposing side bars of the jig 5 are provided with jig pins 3 extending internally. Conventionally, in a pellicle manufacturing process, a pellicle frame 1 was positioned and fixed as a tapered head of a jig pin 3 was embedded in an entrance portion of a frame handling jig hole 2 (hereinafter merely referred to as "jig hole") having a bore diameter smaller than the diameter of the jig pin 3, as shown in FIG. 2.

However, in the case of this conventional procedure of using the jig in the pellicle manufacturing process, although it was possible to fix the pellicle frame after properly positioning the pellicle frame, once the pressure by which the jig pin urges itself upon the entrance portion of the jig hole is reduced in consideration of reducing the pellicle frame distortion and deformation, the possibility of inadvertently allowing the pellicle frame to fall was not low.

Accordingly, in order to prevent such falling of the pellicle frame, it was necessary to maintain a relatively high pressure to urge the jig pin upon the pellicle frame, and as a result, the pellicle produced in such a circumstance as this tends to experience distortion and deformation in its frame, and thus the flatness of the pellicle tends to be instable.

PRIOR ART LITERATURE

[IP Publications]

| [IP Publication 1] | Japanese Patent Application Publication S58-219023 (1983) |
|---|---|
| [IP Publication 2] | U.S. Pat. No. 4,861,402 |
| [IP Publication 3] | Japanese Examined Patent Application Publication S63-27707 (1988) |
| [IP Publication 4] | Japanese Patent Application Publication H07-24390 (1995) |

DISCLOSURE OF THE PRESENT INVENTION

Problems the Present Invention Seeks to Solve

The present invention was made in view of solving the above problems, and hence the object of the present invention is to provide a pellicle kit including a jig to be used in a pellicle manufacturing process suitable to manufacture a pellicle having less distortion and deformation.

Means to Solve the Problems

The pellicle kit for pellicle manufacturing process according to the present invention is an assembly for pellicle manufacturing process having a pellicle frame and a jig including a jig pin, wherein the jig pin is adapted to be inserted into a jig hole of the pellicle frame to thereby fix the pellicle frame in a predetermined position, and in particular the fore end of the jig pin is disposed to abut against a tapered bottom face of the jig hole to thereby impose a pressure upon the tapered bottom face to effect fixing of the pellicle frame.

Effect of the Invention

According to the pellicle kit for pellicle manufacturing process of the present invention, the fore end portion and part of the main body portion of the jig pin are entered into the depth of the jig hole, so that even when some accidental trouble takes place, the chance for the pellicle frame to fall is extremely low. Furthermore, as it is so designed that the jig pin has a diameter sufficiently smaller than the diameter of the jig hole, even in cases wherein a pellicle frame bar expands or contracts or wherein there is some deviation in the dimension of a pellicle frame from the standard specification, the jig pin would not abut against anywhere but the tapered bottom of the jig hole, with a result that the jig pin does not impart such a force as is not intended toward the pellicle frame. Consequently, it is possible to control the bias pressure of the jig pin to a minimum necessary value, and accordingly the pellicle frame undergoes reduced distortion and deformation during the pellicle manufacturing process.

BRIEF DESCRIPTION OF THE DRAWINGS

FIG. 1 This is an explanatory cross section showing how an inventive kit for manufacturing a pellicle may be used.

FIG. 3 This is an explanatory drawing showing the inventive kit for manufacturing a pellicle.

EMBODIMENTS OF PRACTICING THE INVENTION

Figure 2:
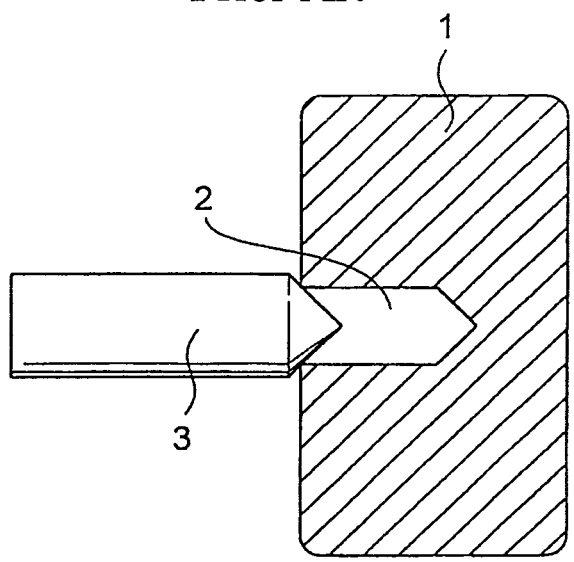
FIG. 2 This is an explanatory cross section showing how a conventional kit for manufacturing a pellicle is used.

Now, the detail of the present invention shall be explained with reference to the drawings.

FIG. 1 shows a state wherein a jig pin 3 of the kit for manufacturing a pellicle according to the present invention is inserted into a jig hole 2 of a pellicle frame 1 and it is seen that the fore end portion of the jig pin 3 is abutted against the tapered face 4 formed in the bottom area of the jig hole 2 whereby the jig pin 3 presses itself against the pellicle frame 1.

Ordinarily, a pellicle frame has two jig holes in each one of two longer bars, and the diameter of the jig hole is 1.6 mm, and the bottom of the jig hole is tapered by an angle of 120 degrees. This tapered bottom hollow, as shown in FIG. 1, converges with the depth of the jig hole. The distance between the entrance of the jig hole and the tapered bottom is normally 0.8 to 1.3 mm. The pellicle frame of the kit for manufacturing a pellicle of the present invention may be of a kind other than the one described above, but it must have a jig hole with converging hollow in its extreme depth, as shown in FIG. 1.

The pellicle kit for manufacturing a pellicle according to the present invention is designed such that the fore end portion of the jig pin is disposed to abut against the tapered face of the tapered bottom formed in the extreme depth of the jig hole to thereby press upon the tapered face and stay the pellicle frame, and, therefore, the entirety of the fore end portion of the jig pin is entered into the jig hole, with the result that the spring of the mobile portion (not shown) of the jig pin can have softened bias such that, compared to the kit of a construction shown in FIG. 2, wherein only a part of the tapered fore end portion of the jig pin enters the entrance area of the jig hole of the pellicle frame, the possibility of the pellicle frame's falling is extremely low.

In the pellicle kit for manufacturing a pellicle according to the present invention, there is no limit to the shape of the fore end portion of the jig pi, so long as the fore end portion can abut against the tapered face of the tapered area formed in the extreme depth of the jig hole; however, from the viewpoint of not damaging the jig hole of the pellicle frame, it is preferable that the fore end portion is rounded.

Also, from the viewpoint of overseeing of the machining precision it is especially preferable if the fore end portion of the jig pin is of a semi-spherical shape.

In the pellicle kit for manufacturing a pellicle according to the present invention, there is no limit to the shape of the main body portion of the jig pin, but generally it is cylindrical.

It is necessary that the thickness of the main body portion of the jig pin is smaller than the diameter of the jig hole so that the jig pin can enter the jig hole, and in particular, if the main body portion is cylindrical, the diameter of the main body portion is preferably smaller than the diameter of the jig hole by 0.5 mm or more, and also it is preferable that when the pellicle is stayed by the jig pins, the clearance between the inner wall of the jig hole and the main body portion of the jig pin is 0.2 mm or more.

In the pellicle kit for manufacturing a pellicle according to the present invention, there is no limit to the number of the jig pins so long as the jig pins are many enough to support the pellicle frame stably; however, it is preferable that two or more jig pins are adapted to enter the jig holes made in each one of the long bars of the pellicle frame and that at least two of the jig pins for one of the bars are compressible pins equipped with a spring to contract and expand freely in the lengthwise direction.

In fixing a pellicle frame using the jig for pellicle manufacturing according to the present invention, the spring's bias load built in the compressible pin can be such that the pellicle frame receives a load of 1.0 g or smaller.

In the case of a conventional jig for manufacturing a pellicle, the strength of the spring in the depressible portion of the jig pin had to be such that about one gram load is applied when the spring is depressed by 1 mm; however, in the case of the pin-and-hole design of the present invention, it is possible to lower the applicable load to as small as 0.5 gram to keep the pellicle frame from falling. Incidentally, it is possible, if required, to nullify the effect of pellicle frame distortion by weakening the strength of the spring further.

In a pellicle manufacturing process, there are occasions on which the pellicle frame is heated by necessity. In a case of an ordinary pellicle for semiconductor-related application (in which the jig holes are made 104 mm apart from each other), when the frame is heated to a temperature of 150 degrees centigrade or so, the frame bars extend by about 0.3 mm.

In the case of a conventional pellicle kit for manufacturing a pellicle, the tapered fore end portion of a jig pin is firmly abutted against the entrance edge of a jig hole so that the bar of the pellicle frame is prevented from extending lengthwise and as a result the pellicle frame undergoes distortion.

However, in the case of the pellicle kit for manufacturing a pellicle of the present invention, the depth by which the jig pin is inserted in the jig hole is so large that it is possible, without worrying the falling of the pellicle frame, to weaken the bias force of the spring of the jig pin whereby the firmness by which the jig pin presses itself against the frame can be lowered, and when the frame is heated at high temperatures and it is urged to extend in the direction of the length of its longer bars, and if the extension is not much larger than about 0.3 mm, such extension is scarcely prevented from occurring as the clearance between the inner wall of the jig hole and the main body portion of the jig pin is sufficiently large to take care of it and the jig pins are not pressed too hard to allow such extension.

Accordingly, the pellicle frame is not prevented from expanding by external forces and, compared with the case of the conventional pellicle kit, it will have substantially smaller distortion in spite of the thermal expansion.

EXAMPLES

We will now explain the present invention in detail by means of examples.

The distortion of the pellicle frame was measured and rated in terms of two kinds: a distortion occurring in the direction of the plane including an annular face of the pellicle frame and a distortion in the flatness of the pellicle frame. As for the planar distortion, the distance between the middle points of the longer pellicle frame bars and the distance between the middle points of the shorter pellicle frame bars were measured. As for the flatness, an imaginary plane obtained by measuring the altitudes of the eight points residing at the four corners of the pellicle frame and the four middle points of the four frame bars was used to quantify the deviation therefrom of each measurement point, and the rating was made in terms of the average of the results.

Example 1

As a pellicle frame, one made of an aluminum alloy (JIS A7075) was prepared, which was black almite-anodized in the surface and measured externally 150 mm by 122 mm and 3.5 mm in height and 2 mm in the width of the pellicle bar. Each of the longer frame bars were bored to have two jig holes in its outer side face at positions 52 mm away from the middle of the respective longer frame bar and all were distanced from the pellicle membrane side annular face of the frame by 1.75 mm; each jig hole measured 1.6 mm in diameter and 1.2 mm in depth and the extremity of each hole was tapered to have an apex angle of 120 degrees. The frame was inspected with an image measurement device and found that the distance between the middle points of the longer frame bars was 122.01 mm and that between the shorter frame bars was 149.98 mm.

Then the flatness of this pellicle frame was measured with a three-dimensional coordinate measuring machine called BH506 (a product manufactured by Mitutoyo Corporation), and the result was 6 micrometers. A jig for manufacturing a pellicle of the present invention having jig pins, whose main body diameter was 0.8 mm and whose fore end was in a shape of semi sphere of a radius 0.4 mm, was coupled with the above-mentioned pellicle frame to thereby form a pellicle kit for manufacturing a pellicle. Of the jig pins of this jig two on one of the two opposing side bars of the jig are compressible and length-regaining pins, and all the others were non-compressible; and the pellicle frame was built in the kit in a manner such that the compressible pins were compressed by 0.5 mm after their ends reached the extremity of each jig hole. The spring load of each compressible pin after the 0.5 mm contraction was 0.3 gram.

The pellicle kit for manufacturing a pellicle composed of the jig and the pellicle frame was passed through the conventional pellicle manufacturing steps wherein a mask bonding agglutinant was applied to an annular face of the frame and the kit was let to sit for 60 minutes and then was heated at 150 degrees centigrade in a high frequency induction heating apparatus to dry. After applying a membrane bonding adhesive to the other annular face of the frame and drying the adhesive, the pellicle membrane was attached to the frame to complete a pellicle. After the completion, the mask bonding agglutinant was removed from the pellicle frame and the distance between the middle points of the longer frame bars and that between the middle points of the shorter frame bars were measured with the image measurement device, and they were found to be 120.00 mm and 149.99 mm, respectively. Next, using the three-dimensional coordinate measuring machine, BH506, manufactured by Mitutoyo Corporation, the flatness of the frame was measured and it was found to be 9 micrometers.

Example 2

A pellicle frame was prepared in the similar manner as in Example 1, and the frame was set to couple with a jig for manufacturing a pellicle, which had been tailored to the frame. In Example 2, the compressible pins of the jig were let to have a spring load of 0.6 grams. The distance between the middle points of the longer frame bars and that between the middle points of the shorter frame bars were measured, and they were 122.00 mm and 149.99 mm, respectively. Also the frame flatness measured 5 micrometers.

Then, in the similar manner as in Example 1, the pellicle kit was passed down through the pellicle manufacturing steps, and thereafter the distance between the middle points of the longer frame bars and that between the middle points of the shorter frame bars were measured as well as the flatness of the frame, and the results were 121.98 mm, 150.20 mm and 9 micrometers, respectively.

Example 3

Similarly as in Examples 1 and 2, a pellicle frame was prepared, and was coupled with a jig tailored to the frame. In Example 3, the compressible pins of the kit were let to have a spring load of 1.0 gram. The distance between the middle points of the longer frame bars and that between the middle points of the shorter frame bars were measured, and they were 122.01 mm and 150.00 mm, respectively. Also the frame flatness measured 6 micrometers.

Then, in the similar manner as in Examples 1 and 2, the pellicle kit was passed down through the pellicle manufacturing steps, and thereafter the distance between the middle points of the longer frame bars and that between the middle points of the shorter frame bars were measured as well as the flatness of the frame, and the results were 121.98 mm, 150.20 mm and 11 micrometers, respectively.

Comparative Example 1

Similarly as in Examples 1 through 3, a pellicle frame was prepared. Two of the jig pins on one of the two opposing side bars of the jig were compressible and length-regaining and all the other pins were non-compressible; the compressible jig pins used in the jig of Comparative Example 3 had a main body diameter of 2 mm, and its fore end conical section had an apex angle of 90 degrees. The compressible pins were applied to the pellicle frame in a manner such that their spring load was controlled to be 0.6 gram.

The distance between the middle points of the longer frame bars and that between the middle points of the shorter frame bars were measured and found to be 122.01 mm and 150.00 mm, respectively. The flatness measured 6 micrometers.

Then, in the similar manner as in Examples 1 through 3, the pellicle kit was pass down through the pellicle manufacturing steps, and thereafter the distance between the middle points of the longer frame bars and that between the middle points of the shorter frame bars were measured as well as the flatness of the frame, and the results were 121.96 mm, 150.20 mm and 15 micrometers, respectively.

Comparative Example 2

In the similar manner as in Comparative Example 1, the pellicle frame and the jig were prepared and were coupled together to form a pellicle kit in a manner such that the compressible jig pins were controlled to have a spring load of 1.0 gram.

The distance between the middle points of the longer frame bars and that between the middle points of the shorter frame bars were measured and were found to be 122.02 mm and 150.00 mm, respectively. The flatness of the frame was measured and found to be 5 micrometers.

Then, in the similar manner as in Comparative Example 1, the pellicle kit was pass down through the pellicle manufacturing steps, and thereafter the distance between the middle points of the longer frame bars and that between the middle points of the shorter frame bars were measured as well as the flatness of the frame, and the results were 121.95 mm, 150.20 mm and 21 micrometers, respectively.

[Rating]

From the results of Examples and Comparative Examples, it was found that the smaller the spring load of the compressible jig pins, the better the pellicle frame is restricted from undergoing a distortion in the direction of the plane including an annular face of the pellicle frame and a distortion in the flatness of the pellicle frame.

The jig pins of the pellicle kit for manufacturing a pellicle according to the present invention have a dimension such that they can enter the jig holes until they reaches the extremity of the jig holes so that there is decreased danger for the pellicle frame to fall so much so that, compared to the compressible jig pins of the conventional pellicle kit for manufacturing a pellicle, it is possible to make the spring load of the compressible jig pins of the present pellicle kit substantially smaller. As the result, it was confirmed that the pellicle kit for manufacturing a pellicle according to the present invention can produce a pellicle in which the deformation and distortion of the frame are substantially reduced so that when such pellicle is attached to the exposure stencil, the latter undergoes scarce warping and deformation.

It was also confirmed that even when the spring load of the compressible jig pins are set to the same value, the pellicle kit for manufacturing a pellicle of the present invention, in which the fore end of the jig pin is semicircular and can abut against the extremity of the jig hole, can produce a less deformed and more flat pellicle frame than a conventional pellicle kit, in which the tapered head pins can abut against the entrance edge of the jig holes of the pellicle frame.

What is claimed is:

1. A pellicle kit for manufacturing a pellicle comprising:
   a rectangular pellicle frame having one pair of opposite frame bars and jig holes, each having a tapered bottom face, in the pair of opposite frame bars; and
   a jig having a pair of opposite and parallel side bars and at least one jig pin on each of the pair of opposite and parallel side bars, the at least one jig pin being capable of entering one of said jig holes until a front end of the jig pin abuts against the tapered bottom face of one of said jig holes to thereby fix said pellicle frame.

2. A pellicle kit for manufacturing a pellicle according to claim 1, wherein the front end of the at lease one jig pin is rounded.

3. A pellicle kit for manufacturing a pellicle according to claim 1, wherein the front end of the at lease one jig pin is semispherical.

4. A pellicle kit for manufacturing a pellicle according to claim 1, wherein said at lease one jig pin includes a cylindrical main body portion.

5. A pellicle kit for manufacturing a pellicle according to claim 1, wherein the jig pin includes a main body portion; and
   a diameter of the main body of the at lease one jig pin, is smaller than a diameter of one of the jig holes of the pellicle frame by 0.5 mm or more, and when the pellicle frame is fixed by at least one jig pin, a clearance between an inner wall of one of the jig holes and the main body portion of the at lease one jig pin is 0.2 mm or greater.

6. A pellicle kit for manufacturing a pellicle according to claim 5, wherein said jig has at least two jig pins on one of said pair of opposite and parallel side bars, and at least two of said jig pins are compressible pins, each having a spring capable of freely contracting in a lengthwise direction and regaining an original length of the jig pins.

7. A pellicle kit for manufacturing a pellicle according to claim 6, wherein a spring load by which said jig pin urged against the tapered bottom face of a jig hole is 1.0 gram or smaller.

8. A pellicle kit for manufacturing a pellicle according to claim 2, wherein the at least one jig pin includes a cylindrical main body having a diameter smaller than that of the jig holes so that the cylindrical main body enters one of the jig holes and the front end of the at least one jig pin directly abuts against the tapered bottom face.

9. A pellicle kit for manufacturing a pellicle according to claim 8, wherein the front end of the at least one jig pin is rounded; and
   two jig pins are arranged on each of the pair of side bars, and the jig pins have a spring to contract and expand in a lengthwise direction of the jig pins.

10. A pellicle kit for manufacturing a pellicle according to claim 9, wherein a predetermined length of the main body portion is entered in one of the jig holes when the at least one jig fixes the pellicle frame.

* * * * *